(12) United States Patent
Sowders et al.

(10) Patent No.: US 8,421,472 B2
(45) Date of Patent: Apr. 16, 2013

(54) APPARATUSES AND METHODS FOR TESTING WELDING APPARATUSES

(75) Inventors: Earl H. Sowders, Georgetown, KY (US); Barry M. Boggs, Lexington, KY (US); F. Keith Waters, Lexington, KY (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 435 days.

(21) Appl. No.: 12/721,597

(22) Filed: Mar. 11, 2010

(65) Prior Publication Data

US 2011/0221448 A1 Sep. 15, 2011

(51) Int. Cl.
*G01R 31/14* (2006.01)
(52) U.S. Cl.
USPC ............................ 324/511; 324/509; 361/42
(58) Field of Classification Search .......... 324/509–511; 361/42–50
See application file for complete search history.

(56) References Cited

U.S. PATENT DOCUMENTS

| | | | | |
|---|---|---|---|---|
| 2,858,507 A * | 10/1958 | Liautaud et al. | ............... | 324/510 |
| 3,619,773 A | 11/1971 | Lathrop | | |
| 3,798,540 A * | 3/1974 | Darden et al. | ................ | 324/510 |
| 3,813,021 A | 5/1974 | Kramer | | |
| 3,908,286 A * | 9/1975 | Dean et al. | ...................... | 324/509 |
| 4,001,646 A * | 1/1977 | Howell | ............................ | 361/45 |
| 4,394,615 A * | 7/1983 | Rocci, Jr. | ...................... | 324/510 |
| 4,507,699 A | 3/1985 | Rohm | | |
| 4,963,830 A * | 10/1990 | Roth et al. | ..................... | 324/715 |
| 5,270,638 A * | 12/1993 | Mellott | ......................... | 324/509 |
| 5,469,063 A * | 11/1995 | Winter | ......................... | 324/508 |
| 5,930,093 A | 7/1999 | Morrissett | | |
| 6,347,025 B1 | 2/2002 | Ulrich et al. | | |
| 6,437,951 B1 | 8/2002 | Ahlstrom et al. | | |
| 6,788,504 B2 | 9/2004 | Vanderkolk | | |
| 6,831,838 B1 | 12/2004 | Boyce | | |
| 7,323,878 B2 * | 1/2008 | Gaston et al. | ................. | 324/510 |
| 2003/0223163 A1 | 12/2003 | Robbins | | |
| 2005/0207075 A1 * | 9/2005 | Callen et al. | .................... | 361/42 |
| 2009/0251839 A1 | 10/2009 | Cruz | | |

* cited by examiner

*Primary Examiner* — Arleen M Vazquez
(74) *Attorney, Agent, or Firm* — Dinsmore & Shohl LLP

(57) ABSTRACT

A testing apparatus for testing a welding apparatus is disclosed. The testing apparatus includes a receptacle, a fault indicator, and a power supply. The receptacle includes a grounding socket and a plurality of power sockets. The power supply is electrically coupled to the grounding socket, the fault indicator, and at least one of the plurality of power sockets. When a plug of the welding apparatus is matingly coupled to the receptacle, the fault indicator indicates whether an electrical resistance between a grounding prong of the plug and at least one of a plurality of power prongs of the plug is below a predetermined threshold.

20 Claims, 3 Drawing Sheets

APPARATUSES AND METHODS FOR TESTING WELDING APPARATUSES

TECHNICAL FIELD

The present specification generally relates to apparatuses and methods for testing welding apparatuses.

BACKGROUND

Welding apparatuses are typically used to joint two pieces of metal or plastic together. There are many different types of welding apparatuses, including arc welders, laser welders, ultrasonic welders, and so forth. Some welding apparatuses may use electrical energy in order to perform their task, which can conveniently be accessed from the local electrical grid. Accordingly, many welding apparatuses have an electrical cable and a plug which facilitates plugging the welding apparatus into the local electrical grid. The electrical cable may comprise a grounding conductor and a plurality of power conductors which are configured to carry the electrical energy from the plug to the welding apparatus in order to supply the energy necessary to operate the welding apparatus.

The power conductors and grounding conductor of the welding apparatus can be mis-wired when the welding apparatus is manufactured or can become mis-wired after the welding apparatus is serviced. For example, the grounding conductor and one of the power conductors may be inadvertently swapped. Such a condition may cause the welding apparatus to operate improperly. Thus, it may be desirable to test the welding apparatus to determine if the grounding conductor or power conductors are mis-wired before plugging the welding apparatus into the local electrical grid.

SUMMARY

In one embodiment, a testing apparatus for testing a welding apparatus comprises a receptacle, a fault indicator, and a power supply, wherein: the receptacle comprises a grounding socket and a plurality of power sockets; the power supply is electrically coupled to the grounding socket, the fault indicator, and at least one of the plurality of power sockets; and when a plug of the welding apparatus is matingly coupled to the receptacle, the fault indicator indicates whether an electrical resistance between a grounding prong of the plug and at least one of a plurality of power prongs of the plug is below a predetermined threshold.

In another embodiment, a method for using a testing apparatus to test a welding apparatus having a plug comprises: matingly coupling the plug comprising a grounding prong and a plurality of power prongs to a receptacle of the testing apparatus, the receptacle comprising a grounding socket and a plurality of power sockets such that, when matingly coupled to the plug, the grounding socket is electrically coupled to the grounding prong, and the plurality of power sockets are electrically coupled to the plurality of power prongs; electrically coupling a power supply of the testing apparatus to the grounding socket and at least one of the plurality of power sockets; automatically determining whether an electrical resistance between the grounding prong and at least one of the plurality of power prongs is below a predetermined threshold; and using a fault indicator to automatically indicate whether the electrical resistance is below the predetermined threshold.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments described herein generally relate to apparatuses and methods for testing welding apparatuses, including but not limited to portable welders as well as stationary welders of various types. The welding apparatus may include a plug through which electrical power passes in order to operate the welding apparatus. As will be described in greater detail below, the testing apparatus may be configured to determine whether the electrical resistance between a grounding prong of the plug and a power prong of the plug is below a predetermined threshold. Such a determination may indicate whether conductors of the welding apparatus (the grounding and power conductors) are mis-wired.

Figure 1:
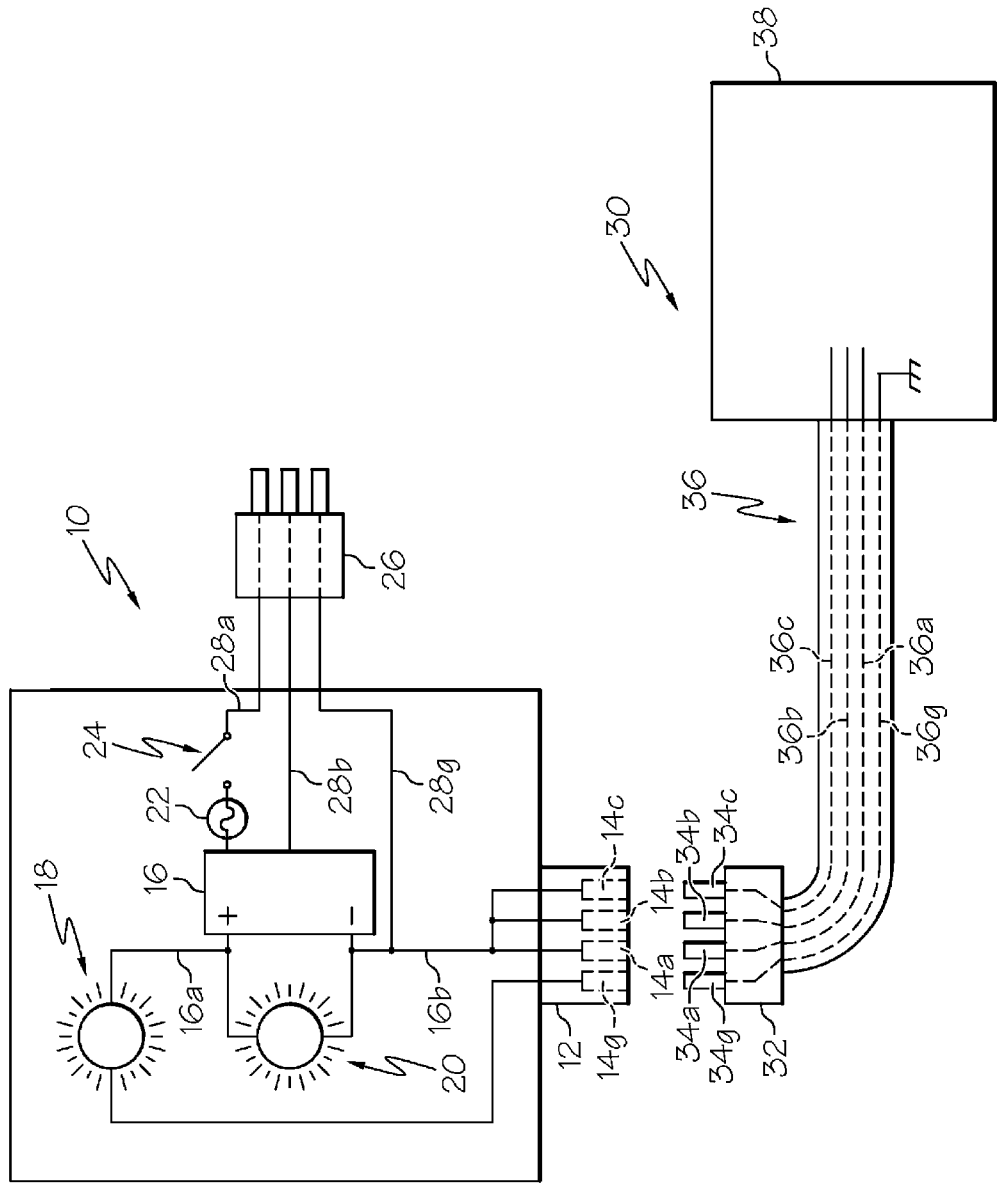
FIG. 1 depicts a testing apparatus for testing welding apparatuses according to one or more embodiments shown and described herein.

Referring to FIG. 1, an embodiment of a testing apparatus 10 may generally include a receptacle 12, a power supply 16, and a fault indicator 18. The receptacle 12 may include a grounding socket 14g and a plurality of power sockets 14a-c, which may include many different types of sockets, such as but not limited to ferrules and spade-type sockets. The sockets may be constructed of an electrically conductive material, such as copper or aluminum. The receptacle 12 may be configured to matingly couple to a plug 32 of the welding apparatus 30. The plug 32 may include a grounding prong 34g and a plurality of power prongs 34a-c, which may include many different types of prongs, such as but not limited to round prongs and spade-type prongs. The prongs may be constructed of an electrically conductive material, such as copper or aluminum. The plug 32 may be disposed at the end of a power cable 36 which is coupled to the welding apparatus 30 for delivering electrical power thereto. The power cable 36 may include a grounding conductor 36g and a plurality of power conductors 36a-c, wherein each conductor may include a flexible conductor of electricity such as copper or aluminum. The plug 32 and power cable 36 may be configured to deliver electrical power to operate the welding apparatus 30, such as when the plug 32 is electrically coupled to a power outlet of an electrical grid (not shown).

When coupled to a power outlet of the electrical grid, the grounding prong 34g (via the grounding conductor 36g) may connect, inter alia, the housing 38 of the welding apparatus 30 to earth ground. This may permit any exposed parts of the welding apparatus 30 (e.g., the housing 38) to be electrically coupled to the earth ground, including parts which may come into contact with an operator of the welding apparatus 30. In this fashion, the exposed parts of the welding apparatus 30 may have little or no voltage on them with respect to earth ground which may inhibit or prevent an electrical hazard for anyone who comes in contact with these exposed parts. The grounding prong 34g may provide other functions for the welding apparatus 30 as well, such as for example providing a shield for electrical components which may either generate or be susceptible to electrical noise. As an example, the housing 38 of the welding apparatus 30 may be electrically coupled to the grounding prong 34g so that an operator of the welding apparatus 30, who may come into contact with the housing 38 of the welding apparatus 30 during operation, may not be exposed to high voltages.

The plug 32 may be configured so that it must be physically oriented a certain way in order to be matingly coupled to a receptacle. For example, the prongs of the plug 32 may have an asymmetrical physical arrangement. This may insure that the grounding prong 34g can only be inserted into the grounding socket, and the power prongs 34a-c can only be inserted into the power sockets. In this fashion, the grounding prong 34g may always be connected to earth ground when the plug 32 is matingly coupled to a corresponding receptacle of the local power grid.

The power cable 36 may include a grounding conductor 36g and a plurality of power conductors 36a-c. Although three power conductors 36a-c are shown in FIG. 1, it is contemplated that more or less power conductors may be used. Many welding apparatuses may use three power conductors 36a-c since they are designed to operate from a three-phase power source (e.g., the local electrical grid). Likewise, the plug 32 may include a grounding prong 34g and a plurality of power prongs 34a-c. Typically, the number of power prongs 34a-c will be the same as the number of power conductors 36a-c of the power cable 36. Thus, many welding apparatuses requiring a three-phase power source may employ a plug 32 with one grounding prong 34g and three power prongs 34a-c, one for each of the three phases.

During normal operation, the welding apparatus 30 may be plugged into the local electrical grid (via the plug 32) such that the energy necessary to operate the welding apparatus 30 is derived therefrom. Accordingly, electrical current may pass from the electrical grid to the welding apparatus 30 by passing through the plug 32 and the power cable 36. However, when testing the welding apparatus 30, the plug 32 of the welding apparatus 30 may be matingly coupled to the receptacle 12 of the testing apparatus 10. In this configuration, the welding apparatus 30 will not operate since the testing apparatus 10 may not be capable of supplying a suitable voltage and/or current for the welding apparatus 30 to operate. When the welding apparatus 30 is plugged into the testing apparatus 10, the testing apparatus 10 may be configured to determine whether the electrical resistance between the grounding prong 34g of the plug 32 and at least one of the power prongs 34a-c of the plug 32 is below a predetermined threshold. The fact that the electrical resistance is below the predetermined threshold may indicate that the grounding and/or power conductors of the welding apparatus 30 are mis-wired.

Figure 2:
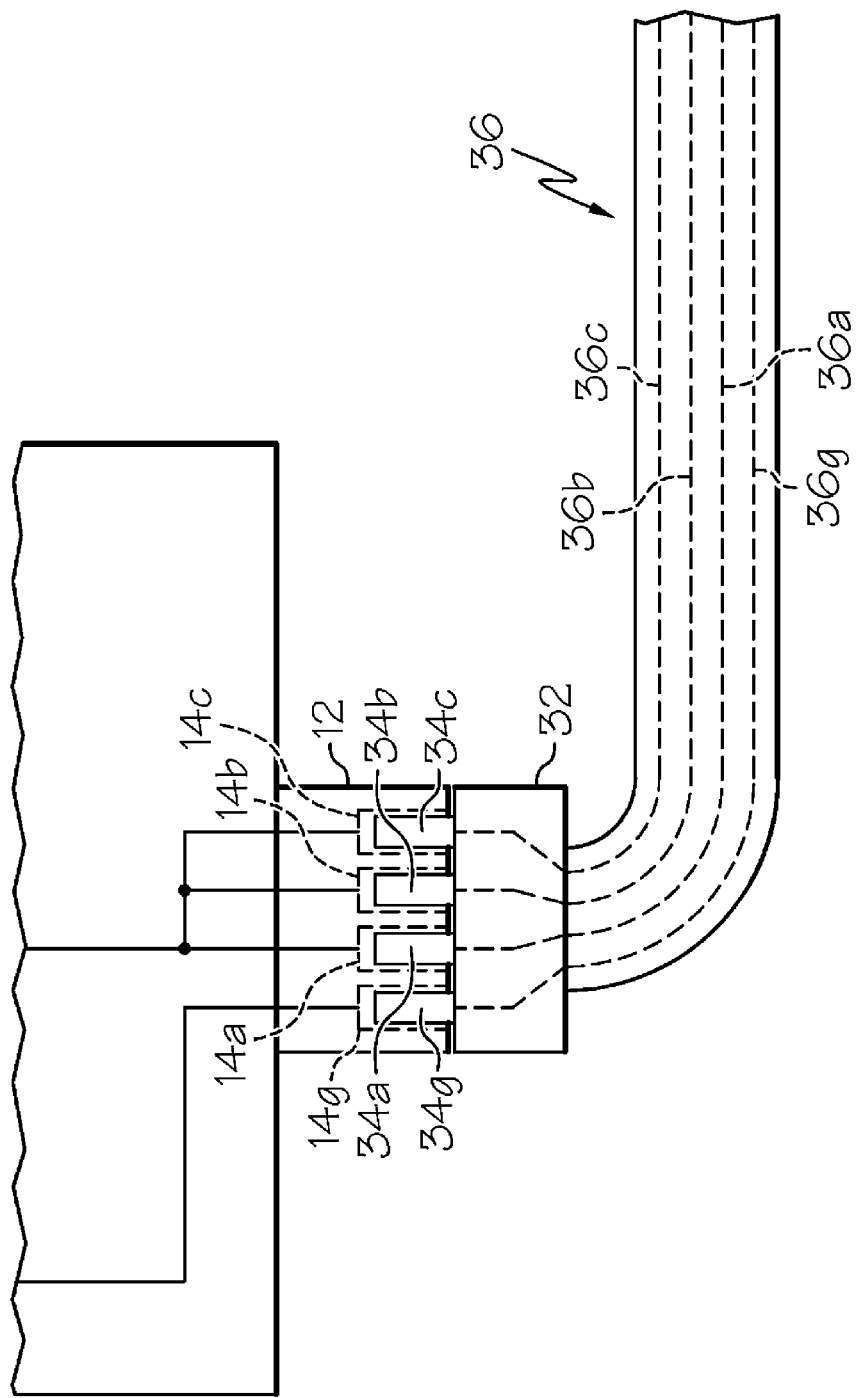
FIG. 2 shows a plug of the welding apparatus matingly coupled to a socket of the testing apparatus according to one or more embodiments described herein.

As shown in FIG. 2, the plug 32 of the welding apparatus 30 and the receptacle 12 of the testing apparatus 10 may be designed so that they are capable of being matingly coupled. Accordingly, the plug 32 and the receptacle 12 may have the same number of power prongs 34a-c and power sockets 14a-c, respectively. When matingly coupled, the grounding prong 34g of the plug 32 may be electrically coupled to the grounding socket 14g of the receptacle 12, and the plurality of power prongs 34a-c may be electrically coupled to the power sockets 14a-c of the receptacle 12. The plug 32 and receptacle 12 may be, for example, an Arktite® brand of plugs and receptacles manufactured by the Cooper Crouse-Hinds Company: the plug may be catalog number APJ6485, while the receptacle may be catalog number AR642. Other suitable types of plugs and receptacles, including those from other manufacturers, may be used as well.

Referring again to FIG. 1, the power supply 16 may be an AC-to-DC power supply which is configured to operate at an input voltage of approximately 120 Volts AC and generate an output of approximately 24 Volts DC. Other suitable input and output voltages may be used as well. The power supply 16 may be, for example, a model ABL7RM24025 manufactured by Schneider Electric. Other suitable types of power supplies, including those from other manufacturers, may be used as well. The power supply 16 may have a voltage output 16a and a voltage return 16b.

The fault indicator 18 may be an incandescent light, a light-emitting diode (LED), buzzer, or other suitable device. The fault indicator 18 may be activated when the testing apparatus 10 detects that the electrical resistance between the grounding prong 34g of the plug 32 and at least one of the plurality of power prongs 34a-c of the plug 32 is below a predetermined threshold. If the fault indicator 18 is a light or LED, it may be activated by either illuminating or extinguishing the light or LED. If an LED is used, the LED may include a resistor so as to limit the amount of electrical current passing through the diode itself. Furthermore, the LED may further include two inverse parallel diodes so that the orientation of the LED's connections does not effect the LED's operation. The fault indicator 18, if a light or LED, may be red (or any other desired color) so as to indicate a fault condition of the welding apparatus 30. If the fault indicator 18 is a buzzer, it may be activated by turning on the buzzer. Other techniques of activating the fault indicator 18 may be used as well. The fault indicator 18 may have two connections as shown in FIG. 1. One of the connections may be electrically coupled to the voltage output 16a of the power supply 16, while the other connection may be electrically coupled to the grounding socket 14g.

The testing apparatus 10 may operate such that the power supply 16 configured to be electrically coupled to the grounding socket 14g, the fault indicator 18, and at least one of the plurality of power sockets 14a-c such that, when the plug 32 is matingly coupled to the receptacle 12, the fault indicator 18 indicates whether an electrical resistance between the grounding prong 34g of the plug 32 and the at least one of the plurality of power prongs 34a-c of the plug 32 is below a predetermined threshold. The testing apparatus 10 may be configured to test each of the power prongs 34a-c individually or all together, as depicted in FIG. 1. When all power prongs 34a-c are tested together, the testing apparatus 10 may short all the power prongs 34a-c together inside the testing apparatus 10.

The predetermined threshold may be approximately 10 Ohms or any other suitable value such as approximately 10 Ohms or more, or approximately 10 Ohms or less. The level of brightness of the fault indicator 18 may depend on how close the electrical resistance is to the predetermined threshold. Thus, the fault indicator 18 may gradually become illuminated as the electrical resistance approaches and surpasses the predetermined threshold. Consequently, there may not be a sharp delineation between the fault indicator 18 being illuminated (e.g., indicating a resistance below the predetermined threshold) and not being illuminated (e.g., indicating a resistance above the predetermined threshold). In another embodiment, the fault indicator 18 may become instantly illuminated once the predetermined threshold is met or exceeded. In other words, the testing apparatus 10 may be designed so that any illumination of the fault indicator 18 means that the resistance is below the predetermined threshold. Many welding apparatuses may be designed so that when not mis-wired, the resistance between the grounding prong 34g and one or more of the power prongs 34a-c is much higher that the predetermined threshold; however, when mis-wired, this resistance may be much lower than the predetermined threshold. In this case, the fault indicator 18 may either be fully extinguished (when not mis-wired) or fully illuminated (when mis-wired).

The testing apparatus 10 of FIG. 1 may operate as follows. The power supply 16 may establish a relatively constant voltage, $V_{PS}$, in the circuit. The electrical resistance of the fault indicator 18, $R_{FI}$, and the electrical resistance between the grounding prong 34g and one or more of the power prongs 34a-c, $R_{GP}$, may be added together such that the current, $I_{FI}$, passing through the fault indicator 18 may be equal to: $V_{PS}/(R_{FI}+R_{GP})$. Thus, the power supply voltage, $V_{PS}$, and/or the electrical resistance of the fault indicator 18, $R_{GP}$, may be adjusted either individually or collectively to establish the desired predetermined threshold. As alternatives to the constant voltage source, the power supply 16 may comprise a battery, a constant current source, or other suitable device, any of which may operate in a similar manner as the constant voltage circuit described above.

The power supply 16 may require an input of approximately 120 Volts AC to operate. The power supply 16 may have a connector 26 which may by plugged into a standard electrical outlet which may provide a line input 28a, a neutral input 28b, and a ground 28g. As such, the connector 26, when plugged into a standard electrical output, may deliver the 120 Volts AC to the power supply 16 for its operation. A fuse 22 may be inserted into the line input 28a for circuit protection or other purposes. The power supply 16 may convert the 120 Volts AC into approximately 24 Volts DC which may include a 24 Volt voltage output 16a and a 24 Volt voltage return 16b. The ground 28g of the connector 26 may be electrically coupled to the 24 Volt voltage return 16b for grounding purposes or other reasons.

The voltage output 16a may be electrically coupled to one of the connections of the fault indicator 18. The other connection of the fault indicator 18 may be electrically coupled to the grounding socket 14g of the receptacle 12. Similarly, the voltage return 16b may be electrically coupled to at least one of the power sockets 14a-c of the receptacle 12. In the embodiment shown, the voltage return 16b is electrically coupled to all the power sockets 14a-c, which are effectively shorted together. When the plug 32 of the welding apparatus 30 is matingly coupled to the receptacle 12, as shown in FIG. 2, the fault indicator 18 may become illuminated if the electrical resistance between the grounding prong 34g of the plug 32 (electrically coupled to the grounding socket 14g) and at least one of the power prongs 34a-c of the plug 32 (electrically coupled to the power sockets 14a-c) is less than a predetermined threshold.

The basic operation of the circuit may be such that, when the resistance between the grounding prong 34g and one of the power prongs 34a-c of the plug 32 is above the predetermined threshold, an insufficient amount of current is passed through the fault indicator 18 in order to make it illuminate. Likewise, when the resistance between the grounding prong 34g and one of the power prongs 34a-c of the plug 32 is below the predetermined threshold, a sufficient amount of current is passed through the fault indicator 18 in order to make it illuminate. As discussed above, the electrical resistance of the fault indicator 18, $R_{FI}$, and the electrical resistance between the grounding prong and one or more of the power prongs, $R_{GP}$, may be added together such that the current, $I_{FI}$, passing through the fault indicator 18 may be equal to: $V_{PS}/(R_{FI}+R_{GP})$. Thus, the power supply voltage, $V_{PS}$, and/or the electrical resistance of the fault indicator 18, $R_{FI}$, may be adjusted to establish the desired predetermined threshold. As an alternative, electrical resistance may be placed in series with the fault indicator 18 in order to adjust the predetermined threshold.

The testing apparatus 10 may also include a power indicator 20 which indicates when the power supply 16 is operating. The power indicator 20 may be an incandescent light or a light-emitting diode which becomes illuminated when the power supply 16 is switched on (e.g., via switch 24, discussed below). Similar to the fault indicator 18, the power indicator 20 may have two connections, one of which may be electrically coupled to the voltage output 16a and the other of which may be electrically coupled to the voltage return 16b. In one embodiment, the power indicator 20 may be green while the fault indicator 18 may be red. A fuse 22 may be inserted in the line input 28a in order to protect the power supply 16. The circuit may further include a switch 24 which is configured to allow a user to conveniently switch the power supply 16 on and off.

Figure 3A:
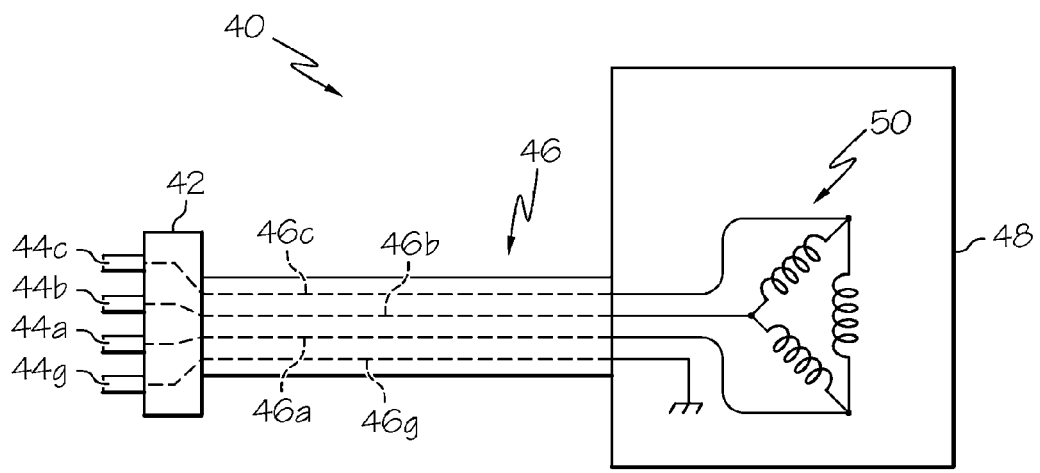
FIGS. 3A and 3B illustrate welding apparatuses according to one or more embodiments described herein.
Figure 3B:
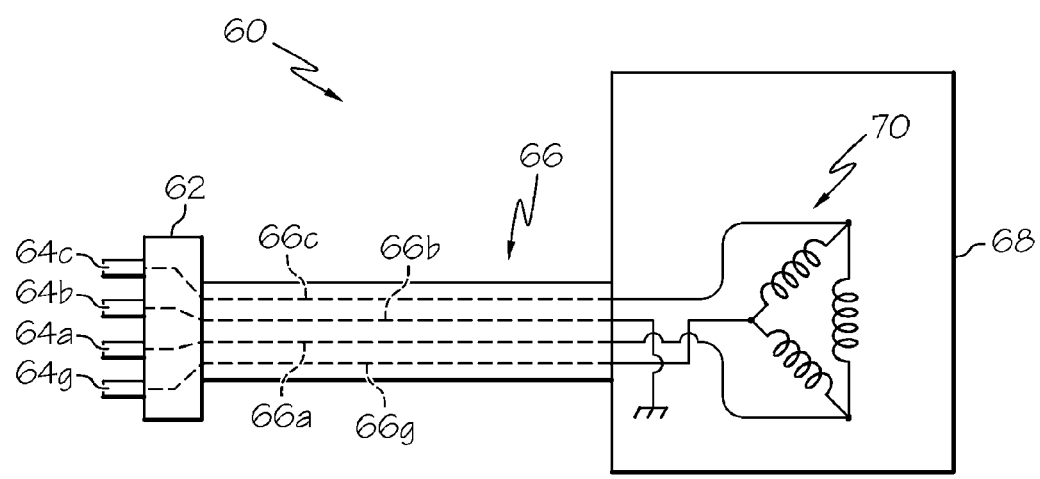

FIGS. 3A and 3B depict embodiments of welding apparatuses. FIG. 3A depicts a welding apparatus 40 which is not mis-wired (i.e., wired properly). The welding apparatus 40 may include a power cable 46 having a grounding conductor 46g and a plurality of power conductors 46a-c. At the end of the power cable 46 may be a plug 42 having a grounding prong 44g (electrically coupled to grounding conductor 46g) and a plurality of power prongs 44a-c (electrically coupled to the power conductors 46a-c). The plug 42 may be configured to be plugged into a local power grid so that current to operate the welding apparatus 40 is passed through the power cable 46. Inside the housing 48 of the welding apparatus 40, the grounding conductor 46g may be electrically coupled to various components of the welding apparatus 40 and provide a grounding function such that no parts of the welding apparatus 40 which can be accessed by the operator will have high voltages. For example, the grounding conductor 46g may be electrically coupled to the housing 48 of the welding apparatus 40. The power conductors 46a-c may be electrically coupled to a transformer 50 or other suitable device so as to provide the electrical energy to operate the welding apparatus 40. The power conductors 46a-c may be electrically coupled to other components of the welding apparatus 40 as well, such as but not limited to diodes, transistors, and relays.

In FIG. 3A, the power conductors 46a-c are not mis-wired and are properly coupled to the transformer 50. As such, the electrical resistance between the power conductors 46a-c and the grounding conductor 46g may be very large, possibly 1,000,000 Ohms or larger due to the electrical characteristics of the transformer 50 and/or the design of welding apparatus 40. If the predetermined threshold is 10 Ohms for example and if the plug 42 of the welding apparatus 40 is matingly coupled to the receptacle 12 of the testing apparatus 10 from FIG. 1, the fault indicator 18 may not become illuminated since the resistance between the grounding prong 44g (and, hence, the grounding conductor 46g) and any of the power prongs 44a-c (and, hence, any of the power conductors 46a-c) may be above the predetermined threshold. The fact that the fault indicator did not become illuminated may indicate that the welding apparatus 40 is not mis-wired.

On the other hand, FIG. 3B depicts a welding apparatus 60 which is mis-wired. Like the welding apparatus from FIG. 3A, the welding apparatus 60 may include a power cable 66 having a grounding conductor 66g and a plurality of power conductors 66a-c. At the end of the power cable 66 may be a plug 62 having a grounding prong 64g (electrically coupled to grounding conductor 66g) and a plurality of power prongs 64a-c (electrically coupled to the power conductors 66a-c). The plug 62 may be configured to be plugged into a local power grid so that current to operate the welding apparatus 60 is passed through the power cable 66. Inside the housing 68 of the welding apparatus 60, the grounding conductor 66g may be mis-wired since it is electrically coupled the transformer 70 instead of the components designed to be grounded (e.g., components which may come into contact with an operator of the welding apparatus). Likewise, power conductor 66b may be mis-wired since it is electrically coupled to the components designed to be grounded instead of the transformer 70. In this example, the power conductor 66b may be electrically coupled to the housing 68 of the welding apparatus 60. Power conductors 66a and 66c may be properly wired to the transformer 70 as in FIG. 3A. Thus, the welding apparatus 60 of FIG. 3B is mis-wired such that the grounding conductor 66g (and, hence, the grounding prong 64g) and power conductor 66b (and, hence, power prong 64b) are electrically swapped. The mis-wired welding apparatus 60 may, if plugged into the local electrical grid, not function properly and may cause the operator to be exposed to high voltages, such as for example 480 Volts AC.

Because of this mis-wiring of the welding apparatus 60, the electrical resistance between the grounding conductor 66g and power conductors 66a and 66c may be less than the predetermined threshold. This may be due to the electrical characteristics of the transformer 70 whose windings may have a relatively low resistance, for example 10 Ohms or less. Thus, if the plug 62 of the mis-wired welding apparatus 60 is matingly coupled to the receptacle 12 of the testing apparatus 10 from FIG. 1, the fault indicator 18 may become illuminated since the resistance between the grounding prong 64g (and, hence, the grounding conductor 66g) and two of the power prongs 64a, 64c (and, hence, the two corresponding power conductors 66a, 66c) is below the predetermined threshold. The fact that the fault indicator becomes illuminated may indicate that the welding apparatus 60 is mis-wired.

The scenario of FIG. 3B is only one of many ways the welding apparatus may be mis-wired. There may be many other ways that the welding apparatus may be mis-wired so as to cause the electrical resistance between the grounding prong of the plug and at least one of a plurality of power prongs of the plug is below a predetermined threshold. Furthermore, the above-described testing apparatus may be used to determine a mis-wired condition of a welding apparatus such that the wired condition of the welding apparatus can be corrected, for example, prior to operation of the apparatus. Systems including the testing apparatus and the welding apparatus operatively connected together, as described above, may also be provided for determining a wired condition of the welding apparatus.

In addition to the testing apparatuses described herein, a method is also disclosed for using a testing apparatus to test a welding apparatus having a plug. The method may comprise the following acts: matingly coupling the plug comprising a grounding prong and a plurality of power prongs to a receptacle of the testing apparatus, the receptacle comprising a grounding socket and a plurality of power sockets such that, when matingly coupled to the plug, the grounding socket is electrically coupled to the grounding prong, and the plurality of power sockets are electrically coupled to the plurality of power prongs; electrically coupling a power supply of the testing apparatus to the grounding socket and at least one of the plurality of power sockets; automatically determining whether an electrical resistance between the grounding prong and at least one of the plurality of power prongs is below a predetermined threshold; and using a fault indicator to automatically indicate whether the electrical resistance is below the predetermined threshold. These acts may be performed in any suitable order.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A testing apparatus for testing a welding apparatus, the testing apparatus comprising a receptacle, a fault indicator, and a power supply, wherein:
   the receptacle comprises a grounding socket and a plurality of power sockets;
   the power supply is electrically coupled to the grounding socket, the fault indicator, and at least one of the plurality of power sockets; and
   when a plug of the welding apparatus is matingly coupled to the receptacle, the fault indicator indicates whether an electrical resistance between a grounding prong of the plug and at least one of a plurality of power prongs of the plug is below a predetermined threshold;
   wherein the predetermined threshold is adjusted by adjusting one or both of a power supply voltage and an electrical resistance of the fault indicator.

2. The testing apparatus of claim 1, wherein the power supply is configured to operate at approximately 24 Volts DC.

3. The testing apparatus of claim 1 further comprising an on-off switch having an on position and an off position, wherein the on-off switch is electrically coupled to the power supply such that:
   when in the off position, the on-off switch turns off the power supply; and
   when in the on position, the on-off switch turns on the power supply.

4. The testing apparatus of claim 1, wherein the fault indicator comprises a light-emitting diode.

5. The testing apparatus of claim 1, wherein the fault indicator illuminates red when the electrical resistance between the grounding prong of the plug and at least one of the plurality of power prongs of the plug is below the predetermined threshold.

6. The testing apparatus of claim 1, wherein the plug of the welding apparatus comprises three power prongs configured to operate at approximately 480 Volts AC and having three phases.

7. The testing apparatus of claim 1 further comprising a power indicator electrically coupled to the power supply and configured to indicate when the power supply is operating.

8. The testing apparatus of claim 7, wherein the power indicator illuminates green when the power supply is operating.

9. The testing apparatus of claim 1, wherein the predetermined threshold is approximately 10 Ohms.

10. The testing apparatus of claim 1, wherein the welding apparatus comprises a portable welder.

11. A method for using a testing apparatus to test a welding apparatus having a plug, the method comprising:
    matingly coupling the plug comprising a grounding prong and a plurality of power prongs to a receptacle of the testing apparatus, the receptacle comprising a grounding socket and a plurality of power sockets such that, when matingly coupled to the plug, the grounding socket is electrically coupled to the grounding prong, and the plurality of power sockets are electrically coupled to the plurality of power prongs;

electrically coupling a power supply of the testing apparatus to the grounding socket and at least one of the plurality of power sockets;

automatically determining whether an electrical resistance between the grounding prong and at least one of the plurality of power prongs is below a predetermined threshold;

using a fault indicator to automatically indicate whether the electrical resistance is below the predetermined threshold; and adjusting the predetermined threshold by adjusting one or both of a power supply voltage and an electrical resistance of the fault indicator.

12. The method of claim 11, wherein the power supply operates at approximately 24 Volts DC.

13. The method of claim 11 further comprising switching on the power supply.

14. The method of claim 11, wherein the fault indicator comprises a light-emitting diode.

15. The method of claim 11, wherein the fault indicator illuminates red when the electrical resistance between the grounding prong of the plug and at least one of the plurality of power prongs of the plug is below the predetermined threshold.

16. The method of claim 11, wherein the plug of the welding apparatus comprises three power prongs configured to operate at approximately 480 Volts AC and having three phases.

17. The method of claim 11 further comprising using a power indicator to indicate whether the power supply is operating.

18. The method of claim 17, wherein the power indicator illuminates green when indicating the power supply is operating.

19. The method of claim 11, wherein the predetermined threshold is approximately 10 Ohms.

20. The method of claim 11, wherein the welding apparatus comprises a portable welder.

* * * * *